United States Patent [19]

Mochizuki et al.

[11] Patent Number: 4,603,275

[45] Date of Patent: Jul. 29, 1986

[54] SURFACE ACOUSTIC WAVE DEVICE USING BEVELED SUBSTRATE

[75] Inventors: Masami Mochizuki; Shinichi Suzuki, both of Yamanashi, Japan

[73] Assignee: Pioneer Electronic Corporation, Tokyo, Japan

[21] Appl. No.: 672,144

[22] Filed: Nov. 16, 1984

[30] Foreign Application Priority Data

Nov. 18, 1983 [JP] Japan .................................. 58-218544

[51] Int. Cl.[4] ............................................ H01L 41/06
[52] U.S. Cl. ............................ 310/313 B; 310/313 D; 333/195
[58] Field of Search ................... 310/326, 312, 313 R, 310/313 A, 313 B, 313 C, 313 D; 333/151, 194, 195

[56] References Cited

U.S. PATENT DOCUMENTS

| | | | |
|---|---|---|---|
| 3,559,115 | 1/1971 | De Vries | 333/194 |
| 3,581,248 | 5/1971 | De Vries | 333/194 |
| 3,582,838 | 6/1971 | De Vries | 333/194 |
| 3,654,500 | 4/1972 | Claiborne | 310/313 R |
| 4,013,983 | 3/1977 | Hartemann | 310/313 A |
| 4,015,448 | 9/1977 | Coussot | 310/312 X |

FOREIGN PATENT DOCUMENTS 0085611 5/1983 Japan .................................. 333/195

*Primary Examiner*—Mark O. Budd
*Attorney, Agent, or Firm*—Finnegan, Henderson, Farabow, Garrett & Dunner

[57] ABSTRACT

A surface acoustic device is formed by cutting a piezoelectric wafer having a number of input and output electrodes on one surface thereof such that at least one end of the device has a bevel adjacent the upper surface. The bevel suppresses the reflection of surface waves. The bevel may be formed by a rotating cutter having a central disc and opposite frustoconical cutters.

5 Claims, 6 Drawing Figures

SURFACE ACOUSTIC WAVE DEVICE USING BEVELED SUBSTRATE

BACKGROUND OF THE INVENTION

The present invention relates to a surface acoustic wave device and a process for producing the same. More particularly, the invention relates to a piezoelectric substrate having uniquely shaped ends and a cutting method for providing such unique shaped ends.

The surface acoustic wave device has interdigital (comb-shaped) electrodes on a piezoelectric substrate for converting electrical signals to surface acoustic waves, and vice versa.

FIG. 1 shows the conventional surface acoustic wave device having a piezoelectric substrate 1 which is typically formed of LiNbO3 (lithium niobate), LiTaO3 (lithium tantalate) or other piezoelectric ceramics. The substrate 1 has on its surface an input electrode 2 which converts input electrical signals to surface acoustic waves 4, and an output electrode 3 which picks up the propagating surface acoustic waves 4 after conversion to electrical signals. While most of the input electrical signals that have been converted to the surface acoustic waves 4 at the input electrode 2 propogate along the surface of the substrate toward the output electrode 3 on the right side of FIG. 1, part of the waves propagate toward the left end of the substrate 1, where that part is reflected back to the output electrode 3. A portion of the surface acoustic waves 4 that have propagated to the output electrode 3 directly from the input electrode 2 pass through the output electrode 3 and reach the right end of the substrate 1 where that portion is reflected back to the output electrode 3. These surface acoustic waves reflecting at either end of the substrate cause ripples in the amplitude characteristics or group delay characteristics in the passband of an elastic wave filter.

This problem is conventionally solved by the following two methods. First, the two ends of the substrate are cut obliquely as shown in FIG. 1 so that the elastic waves reflecting from each end will not return directly to the output electrode 3. The effectiveness of the oblique ends is enhanced by providing them with an absorbing material 5 that absorbs the unwanted surface acoustic waves as much as possible.

By cutting both ends of the substrate obliquely, surface acoustic waves reaching either end can be reflected in such a direction that they will not directly reach the output electrode 3. A portion of the surface acoustic waves 4 created by the input electrode 2 may be reflected at either longer side of the substrate (FIG. 1) before reaching the output electrode 3, but this portion of the elastic waves has a longer travel time through the absorbing material 5 than the usual elastic waves reflecting at both ends of the substrate, and the resulting great propagation loss leads to a low signal level of the reflected waves.

The above method is effective for the purpose of suppressing the surface acoustic waves that have reflected at both ends of the substrate. However, this method requires a parallelpipedic chip, and the materials cost of each chip is high because the number of parallelpipedic chips that can be sliced from a single piezoelectric substrate wafer is smaller than that of the usual square or rectangular chips. Alternatively, square or rectangular chips may first be sliced from the wafer and both ends of each chip are then cut obliquely to a parallelpipedic shape. However, this technique has one extra step as compared with simply slicing a parallelpipedic chip from the wafer.

SUMMARY OF THE INVENTION

In accordance with the invention, the surface wave device has an orthogonal (i.e., square or rectangular) substrate of a piezoelectric material. The substrate has generally parallel sides and parallel ends. An input electrode is on the upper surface of the substrate and an output electrode is at the opposite end on the same upper surface. The electrodes are disposed to generate surface waves on the upper surface of the substrate having the electrodes thereon. The end of the substrate adjacent the output electrode has a transverse bevel across the end disposed to supress reflection of surface waves from the output end.

Therefore, one object of the present invention is to provide a surface acoustic wave device on a square or rectangular substrate chip which effectively suppresses the surface acoustic waves that have reflected at both ends of the substrate.

In the method embodiment of the invention individual surface acoustic wave devices having opposing input and output electrodes on the upper surface of a piezoelectric substrate are formed from a wafer having a plurality of electrode pairs thereon. A rotary cutting tool, having a central cutting disc and two frustoconical cone-like members on opposite sides of the disc, is used to cut the wafer. The cone-like members form a bevel on the edge of the substrate adjacent the upper surface.

Thus, another object of the invention is to provide a process for economically producing such devices.

DESCRIPTION OF THE PREFERRED EMBODIMENTS

Figure 1:
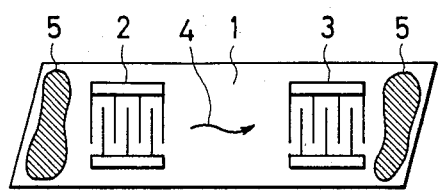
FIG. 1 shows a conventional surface acoustic wave device designated to suppress the surface acoustic waves that have reflected at both ends of the substrate.
Figure 2:
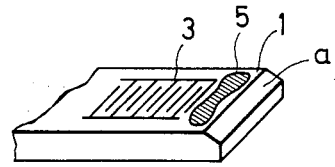
FIG. 2 is a partial view of the surface acoustic wave device according to one embodiment of the present invention.

FIG. 2 is a partial view of a surface acoustic wave device in a rectangular form which has one end beveled by the method of the present invention. Part of the surface acoustic waves that have passed through the output electrode 3 is absorbed by an absorbing material 5 made of an epoxy or silicone resin, and the remainder that is not absorbed by the resin reaches a beveled end 8 from which the waves are reflected into the bulk of the piezoelectric substrate 1. The beveled end 8 may be provided after a rectangular chip is sliced from the piezoelectric substrate wafer, or the slicing and beveling steps may be performed simultaneously. The former method is less desirable since it has one extra step as compared with the latter method.

Figure 3A:
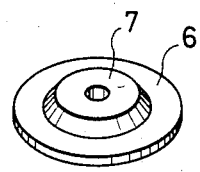
FIG. 3(a) is a perspective view of a blade used in the process of the present invention.
Figure 3B:
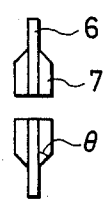
FIG. 3(b) is a cross section corresponding to (a)

A blade that may be used in beveling a chip as it is sliced from the wafer is shown in FIG. 3, wherein FIG. 3(a) is a perspective view and FIG. 3(b) is a cross section. The blade is comprised of a large-diameter disk 6 for cutting the wafer and a smaller-diameter conical frustum 7 formed on both sides of the disk for beveling both ends of the substrate. The two frustums 7 are attached to the disk 6 so that their rotational axes are in alignment.

Figure 4:
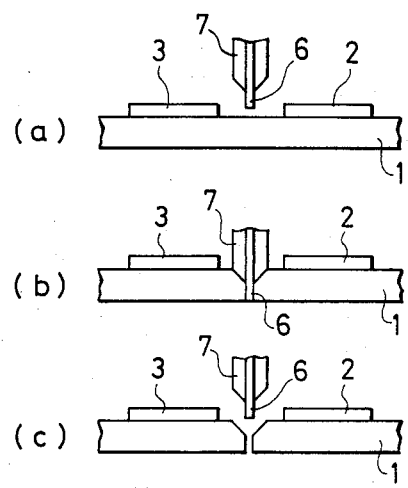
FIG. 4 shows the sequence of steps for cutting the ends of the substrate according to the present invention.

The sequence for cutting the piezoelectric substrate wafer with the blade shown in FIG. 3 is illustrated in FIG. 4: (a) shows the blade placed in the right cutting position, FIG. 4(b) shows the blade that has completed the cutting of the wafer, and FIG. 4(c) shows the blade lifted off the substrate chip after it has been cut from the wafer. The angle between the surface of the substrate 1 and the beveled edge is properly controlled by adjusting $\theta$ which is the angle between the base and side wall of the frustum shown in FIG. 3(b). The angle $\theta$ is preferably set at a value that minimizes the intensity of surface acoustic waves being reflected at the ends of the substrate to return to the output electrode 3. The cutting method of the present invention has the advantage of enabling both the slicing of a chip and the beveling of its ends in a single step.

The blade used in the foregoing embodiment has disk 6 sandwiched between two frustoconical blades 7. If desired, a single blade formed to the shape shown in FIG. 3 may be used.

Figure 5:
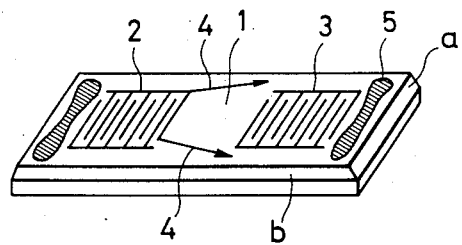
FIG. 5 shows another embodiment of the device of the present invention.

FIG. 5 shows another embodiment of the surface acoustic wave device of the present invention wherein not only one end of the substrate closer to the output electrode 3 but also the longer sides 9 which are generally parallel to the direction of the propagation of the surface acoustic waves are beveled by the method of the present invention.

It is preferred that at least the end of the device adjacent the output electrode be beveled. Performance of the device may also be improved if the opposite end is also beveled.

Part of the surface acoustic waves 4 that are excited by the input electrode 2 in the conventional device impinges on the longer sides of the substrate by beam spreading effect, and after being reflected from these sides, the waves propagate toward the output electrode 3 only for the purpose of impairing the characteristics of the device. This adverse effect of the unwanted reflection from the longer sides of the substrate can be significantly reduced by beveling these longer sides as shown at 9 in FIG. 5. This has the advantage of reducing the width of a chip for use with a surface acoustic wave device such as a long-time delay where the input electrode is distant from the output electrode.

The cutting method of the present invention requires the use of a blade having a special configuration but this blade can be operated by entirely the same method as in the operation of the conventional blade. Therefore, the method of the present invention enables easy fabrication of a surface acoustic wave device by beveling at least one end of the piezoelectric substrate chip as it is sliced from a large wafer. The chip has a square or rectangular shape, so the number of chips that can be sliced from one substrate wafer according to the present invention is greater than that of the conventional parallelpipedic chips. As a result, the present invention offers compact surface acoustic wave devices at lower cost in which the surface acoustic waves that are reflected from both ends of the substrate are suppressed.

What is claimed is:

1. A surface acoustic wave device comprising a piezoelectric substrate having generally parallel sides and ends; an input electrode on said substrate and an opposing output electrode on said upper surface of said substrate; the end of said substrate adjacent said output electrode having a transverse flat bevel across said end disposed to suppress reflection of surface waves from said output end.

2. The device of claim 1 wherein said bevel is adjacent said upper surface.

3. The device of claim 1 wherein both the output end and the input ends of said substrate include a transverse flat bevel.

4. The device of claim 1 wherein the opposite parallel sides of said substrate include longitudinal flat bevels.

5. The device of claim 1 wherein said device has an orthogonal substrate.

* * * * *